(12) United States Patent
Weber

(10) Patent No.: US 7,718,012 B2
(45) Date of Patent: May 18, 2010

(54) METHOD OF DEGASIFICATION IN SEMICONDUCTOR CLEANING

(75) Inventor: Frank Weber, Austin, TX (US)

(73) Assignee: Infineon Technologies AG, Munich (DE)

( * ) Notice: Subject to any disclaimer, the term of this patent is extended or adjusted under 35 U.S.C. 154(b) by 1540 days.

(21) Appl. No.: 11/026,835

(22) Filed: Dec. 30, 2004

(65) Prior Publication Data

US 2006/0144419 A1 Jul. 6, 2006

(51) Int. Cl.
*B08B 3/00* (2006.01)
(52) U.S. Cl. .............................. 134/26; 134/28; 134/30
(58) Field of Classification Search ................... 134/2, 134/26, 28, 19
See application file for complete search history.

(56) References Cited

U.S. PATENT DOCUMENTS

| | | | | |
|---|---|---|---|---|
| 5,451,291 | A | * | 9/1995 | Park et al. .................. 438/702 |
| 5,520,744 | A | * | 5/1996 | Fujikawa et al. .............. 134/11 |
| 5,800,626 | A | | 9/1998 | Cohen et al. |
| 6,295,998 | B1 | | 10/2001 | Kudelka et al. |
| 6,613,692 | B1 | * | 9/2003 | Toshima et al. ............. 438/745 |
| 2002/0050483 | A1 | * | 5/2002 | Yates .......................... 216/79 |
| 2004/0154641 | A1 | | 8/2004 | Montierth |
| 2004/0241596 | A1 | * | 12/2004 | Yamaguchi et al. ......... 430/394 |
| 2006/0035475 | A1 | * | 2/2006 | Verhaverbeke et al. ...... 438/782 |

OTHER PUBLICATIONS

Spuller, M.T., et al., "Incomplete Wetting of Nanoscale Thin-Film Structures," Journal of the Electrochemical Society, vol. 150, No. 8 (2003) pp. G476-G480.

"CRC Handbook of Chemistry and Physics," 60th Edition, CRC Press, Inc., Boca Raton, FL (1979) pp. B-52 & B-131.
"Chemical Engineers' Handbook," 5th Edition, McGraw-Hill Book Company, New York, NY (1973) pp. 3-62-3-63 & 3-96.
"Mass Transfer with Chemical Reaction," Ch. 3, pp. 8-17, [on-line] http://sundoc.bibliothek.uni-halle.de/diss-online/04/04H141/t4.pdf.
Sander, R., "Compilation of Henry's Law Constants for Inorganic and Organic Species of Potential Importance in Environmental Chemistry," Version 3 (Apr. 1999) pp. 1-15. http://www.mpch-maninz.mpg.de/~sander/res/henry.html.
"Gas Scrubbing in Packed Beds: Carbon Dioxide Scrubbing from Air," Chemical Engineering 347, Princeton University (Sep. 1999) pp. 1-18.
Kuzmin, D., et al., "Efficient Numerical Techniques for Flow Simulation in Bubble Column Reactors," Institute of Applied Mathematics (2000) 6 pages.
Butterbaugh, J.W., "Strategies for Cycle Time Reduction in Batch Cleaning," ASMC Proceedings—IEEE/SEMI Advanced Semiconductor Manufacturing Conference and Workshop (2004) pp. 52-56.
Bird,R.B., et al., "Transport Phenomena," John Wiley & Sons, Inc., New York, NY (1960) pp. 531-537.

* cited by examiner

*Primary Examiner*—Michael Cleveland
*Assistant Examiner*—Nicole Blan
(74) *Attorney, Agent, or Firm*—Slater & Matsil, L.L.P.

(57) ABSTRACT

A method of improving the effectiveness of semiconductor cleaning solvents is provided. Insoluble gas bubbles, typically air, hinder wet chemical cleaning methods. Preferred embodiments include purging a first, insoluble gas from the cleaning system and replacing it with a second, soluble gas. After replacing the first gas with the second gas, the wafer is rinsed in the cleaning solvent. Any gas bubbles trapped within narrow, recessed features during cleaning rapidly dissolve due to the second gas's solubility. Temperature adjustments during the process may further enhance cleaning.

17 Claims, 4 Drawing Sheets

METHOD OF DEGASIFICATION IN SEMICONDUCTOR CLEANING

TECHNICAL FIELD

This invention relates generally to semiconductor manufacturing and more particularly to cleaning methods used in the fabrication of semiconductor integrated circuits and devices.

BACKGROUND

Liquid cleaners are widely used in semiconductor manufacturing. One conventional wet process is the well-known RCA process, wherein a wafer is cleaned in hydrogen peroxide ($H_2O_2$) and ammonium hydroxide ($NH_4OH$), followed with a solution of hydrogen peroxide and hydrogen chloride (HCl). Another conventional method, the Piranha clean, includes using a solution of sulfuric acid ($H_2SO_4$) and hydrogen peroxide ($H_2O_2$). Another conventional wet method uses an aqueous ozone solution. A basic requirement shared by all liquid cleaning methods is that the cleaning solvent must at least partially wet a surface.

The parameters known to control wettability include the liquid's surface tension, its contact angle with the surface, and the properties of the surface. Relevant surface properties include its surface energy, roughness, and its hydrophobic or hydrophilic character. Only when the contract angle is less than 90 degrees is a liquid generally considered to wet a surface. Problems associated with incomplete wetting include watermarks left by bubbles, incomplete cleaning, and distortion or collapse of narrow features from asymmetric meniscus forces.

In the past, the time required for the cleaning solution to wet a surface was not a major factor in process throughput. Recently, the introduction of ultrasonic stirring techniques, e.g. megasonics, further extended conventional cleaning methods for sub-micron technologies. However, as devices continue to shrink far below the 90 nm node, problems caused by wetting are predicted to become severe. In particular, cleaning high-aspect-ratio structures, such as DRAM trench capacitors and global interconnects are predicted to be especially problematic for wet chemical cleaning methods. A recent paper by M. T. Spuller et al., published in the Journal of The Electrochemical Society, 150(8), G467-G480 (2003) identified incomplete wetting of recessed nanoscale features as a potentially significant processing factor. This paper by Spuller et al. is hereby incorporated by reference in its entirety.

The analysis by Spuller et al., examined an entrapped gas bubble at the bottom of the recessed feature as illustrated in FIG. 1. By way of example, the recessed feature 10 may include an intermediate interconnect structure formed by etching through an interlevel dielectric 20 to an interconnect layer 30 in another dielectric layer 40. FIG. 1 demonstrates a problem caused by incomplete wetting, i.e. formation of a gas bubble 60. Unless the gas bubble is physically displaced, the only way for the cleaning solution 50 to fully wet the recessed feature is by dissolving the gas bubble 60. Spuller et al. estimated the wetting time $t_d$ by deriving Equation 1 for 1D, diffusion-controlled conditions.

Equation 1:

$$t_d = \left(\frac{\pi}{D}\right)\left(\frac{HP_o hw}{8RT\gamma\cos\theta}\right)^2$$

As shown by Equation 1, the time for the cleaning solution 50 to fully wet the recessed feature is $t_d$ where D is the diffusivity of the gas in the liquid, h is the height of the feature, $P_o$ is the initial pressure of the gas in the feature (typically 1 atm), H is Henry's constant for the gas in the liquid, w is the width of the recessed feature, R is the ideal gas constant, T is the temperature, $\gamma$ is the surface tension of the liquid, and $\theta$ is the contact angle of the liquid on the solid.

Contact angle $\theta$ is shown in FIG. 1. Note that as the contact angle approaches 90°, i.e. as the cleaning solution 50 becomes less wetting, Equation 1 predicts that the wetting time approaches infinity. While the prediction of an infinite wetting time may not be completely accurate, it is qualitatively correct to the extent it predicts that a given cleaning process may be economically unfeasible. For example, the wetting time for an aqueous cleaning solution on a hydrophobic surface having narrow recessed features may be so long as to render a previously used conventional process impractical.

In conclusion, incomplete wetting during semiconductor cleaning causes watermarks, incomplete cleaning, and distortion or collapse of narrow features. Problems such as these may only become worse as devices continue to shrink.

SUMMARY OF THE INVENTION

These and other problems are generally solved or circumvented, and technical advantages are generally achieved, by preferred embodiments of the present invention that provide a method for avoiding wetting problems associated with liquid cleaning solvents.

A method of improving the effectiveness of semiconductor cleaning solvents is provided. Insoluble gas bubbles, typically air, hamper wet chemical cleaning methods. Preferred embodiments of the invention include purging a first, insoluble gas from the cleaning system and replacing it with a second, soluble second gas. After replacing the first gas with the second gas, the wafer is rinsed in the cleaning solvent. Any gas bubbles trapped within narrow, recessed features during cleaning, rapidly dissolve due to the second gas's solubility in the cleaning solvent.

Purging the first gas may include a series of partial evacuation and backfill cycles. Purging may alternatively comprise flowing a stream of the second gas through the cleaning area until the second gas replaces the first gas.

Other embodiments include raising the temperature of the cleaning area during the purging process, thereby enhancing displacement of the insoluble gas. Heating embodiments may further include condensing a portion of the soluble gas's vapor. An embodiment that further includes such condensing comprises heating a wafer area and a vapor area of the cleaning vessel above room temperature before replacing the first gas with the second gas. After rinsing the intermediate semiconductor device, the next step includes condensing a portion of the second gas by cooling at least the vapor area of the cleaning vessel.

Still other embodiments include a second, soluble gas that reacts with the cleaning solution. Such an embodiment advantageously increases bubble removal compared to when diffusion alone controls the process.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts.

The present invention will now be described with respect to preferred embodiments in a specific context, namely a method for cleaning a semiconductor device wherein there is a gas bubble trapped in a narrow recessed feature. The invention may also be applied, however, to other situations wherein partial wetting interferes with wet chemical methods.

Figure 2:
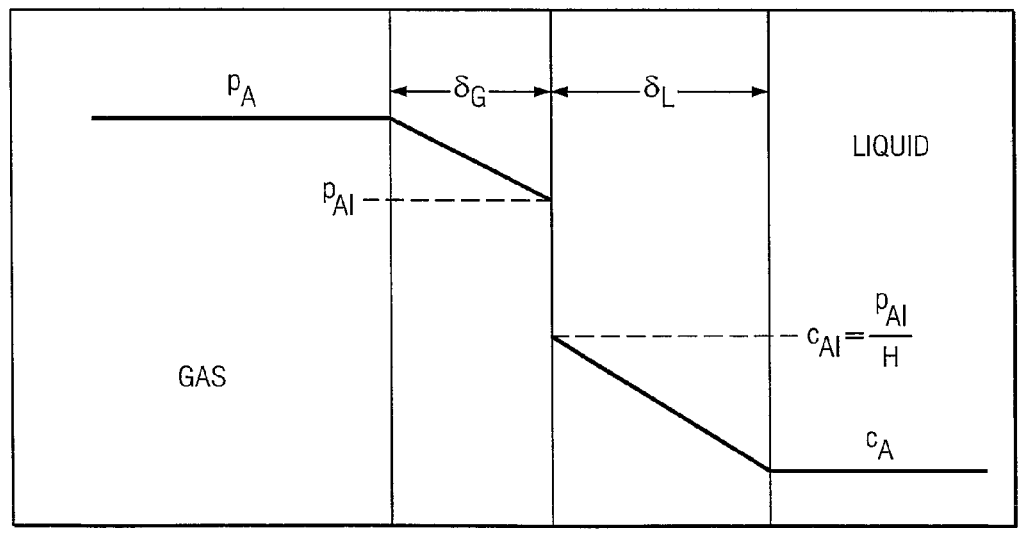
FIG. 2 is one dimensional, gas-liquid interface diffusion model illustrative of preferred embodiments.

In order to make the following description more clear, a brief review of the nomenclature used to describe mass transport follows. The details concerning mass transport models, such as the on described here, are fully explained in *Transport Phenomena* by R. B. Bird et al., John Wiley & Sons (1960). Turning now to FIG. 2, there is illustrated a 1D, gas-liquid stagnant film model that is useful for illustrating preferred embodiments described below.

In the diffusion model illustrated in FIG. 2, there is a gas separated from a liquid by an interfacial region. The gas is comprised of component A that is soluble in the liquid. The bulk gas phase concentration is described the partial pressure, $p_A$, the partial pressure of A, while the liquid phase concentration is described by $c_A$. Separating the two phases is as a stagnant film $\delta_G$ thick in the gas, and a stagnant film $\delta_L$ thick in the liquid phase. In the stagnant film model, the concentration of component A is modeled as being homogeneous outside the stagnant films and varying linearly across the stagnant films, as illustrated in FIG. 2. As further shown in FIG. 2, the interfacial partial pressure of A in the gas phase is $p_{AI}$, and the interfacial concentration of A in the liquid is $c_{AI}$. The interfacial composition is related through the familiar relation $p_{AI}=H_A c_{AI}$, where $H_A$ is the Henry's gas constant of A in the liquid phase.

In keeping with principles known in the chemical arts, the mass flux, $N_A$, from the gas to the liquid is given by Equation 2:

Equation 2:
$$N_A = \frac{(p_A - Hc_A)}{(RT/k_G) + (H/k_L)}$$

In Equation 2, $k_G$ and $k_L$ are the gas and liquid mass transfer coefficients, respectively. Continuing with the stagnant film model of FIG. 2, the $k_G = D_{A,G}/\delta_L$, and $k_L = D_{A,L}/\delta_L$, wherein D is the diffusion coefficient for the respective phases.

In order to illustrate preferred embodiments of this invention, consider a few gases and the implications embodied in Equation 2. For gas sparingly soluble in water, such as nitrogen, the Henry's constant is approximately $1.59 \times 10^3$ (units are atm/(mole/liter)) at room temperature. Likewise, the Henry's gas constant for air, which is primarily nitrogen, is approximately $1.30 \times 10^3$. For carbon dioxide, a slightly soluble gas in water, the Henry's constant is approximately 29.4. For ammonia, a highly soluble gas in water, the Henry's constant is approximately $1.67 \times 10^{-2}$. For sulfur dioxide, a gas with intermediate solubility in water, the Henry's constant is approximately 0.83.

Using readily available vapor-liquid equilibrium data, such as that in The Chemical Engineers' Handbook, McGraw-Hill (1973), the solubility of some of the previously-described gases may be expressed in more conventional solubility units. For example, at room temperature (approximately 20° C.), and at 1 atm, the solubility of some gases in aqueous solutions is as follows. The solubility of air in water is approximately 0.01 mole/liter, the solubility of sulfur dioxide in water is approximately 1.6 mole/liter, and the solubility of ammonia in water is approximately 30 mole/liter.

Terms such as sparingly, slightly, or highly soluble are intended to illustrate, not limit, exemplary embodiments of the invention. Whether a gas is sparingly soluble, slightly soluble, or even highly soluble, depends on the requirements of a specific cleaning application. Fundamentally, however, preferred embodiments solve problems relating to the solubility of a gas during a liquid process. A preferred method includes replacing a first gas with a second gas, wherein the second gas has a higher solubility in the liquid than the first gas. For convenience, the first gas may be labeled insoluble and the second gas labeled soluble, although one skilled in the art understands that such adjectives are only relative terms.

While recognizing that solubility is a relative term, for preferred embodiments comprised of aqueous cleaning solutions, carbon dioxide provides a convenient benchmark for defining solubility. That is, carbon dioxide is considered soluble in a conventional, aqueous cleaning solution at room temperature. Gases less soluble than carbon dioxide are considered insoluble for preferred embodiments comprised of aqueous cleaning solutions. In alternative embodiments, only gases at least as soluble in an aqueous cleaning solvent as sulfur dioxide are considered soluble. In still other embodiments, ammonia defines the minimum solubility. Ammonia has the advantage of being highly soluble in water, but it is more corrosive than carbon dioxide, which makes it more complicated to handle.

Carbon dioxide is the most preferred gas for defining minimum solubility for several reasons. Carbon dioxide is more soluble than air; therefore, it is a viable purging gas for many common cleaning applications. It also inexpensive, easy to handle, available in high purity, well-characterized, non-toxic, and environmentally friendly. Also, carbon dioxide's solubility in water is easily increased using a mild buffer.

In order to more clearly describe embodiments of the invention, the second, more soluble gas is referred to below in functional terms as a purging gas, since the second gas purges the first gas from the cleaning system.

Henry's constant (in aqueous solutions), boiling point, and solubility for potential purging gases are summarized in Table 1. The gases in Table 1 are particularly preferred for aqueous cleaning solutions. The gases are listed by increasing aqueous solubility (least soluble first) as predicted from Henry's gas constant or experimental data.

TABLE 1

| Gas | Formula | H (atm/M) | bp (° C.) | solubility (mole/liter) |
|---|---|---|---|---|
| carbon dioxide | $CO_2$ | 29.4 | −79 (sublimes) | 0.033 |
| hydrogen sulfide | $H_2S$ | 10 | −61 | |
| chlorine dioxide | $ClO_2$ | 1 | 10 | |
| sulfur dioxide | $SO_2$ | 0.83 | −10 | 1.6 |
| dinitrogen tetroxide | $N_2O_4$ | 0.5 | 32 (sublimes) | |
| hydrozoic acid | $HN_3$ | 0.1 | 37 | |
| ammonia | $NH_3$ | 29.4 | −33 | 30 |
| dichlorine monoxide | $Cl_2O$ | 5.9E−02 | 4 | |
| hydrogen peroxide | $H_2O_2$ | 1.0E−04 | 152 | |

For embodiments comprised of non-aqueous cleaning solutions, tabulated solubility data, such as Henry's gas constants, provide a means for selecting soluble purging gases. As described above, the Henry's gas constant for a sulfur dioxide in water is approximately 0.83 atm/(mole/liter) (or approximately 1.64 mole/liter). Therefore, selecting a purging gas having a Henry's gas constant of approximately 0.8 atm/(mole/liter) for the prospective, non-aqueous system should yield a purging gas having similar solubility characteristics as sulfur dioxide in water. If must faster bubble removal is desired, embodiments comprise selecting a gas with H<<0.8 atm/(mole/liter), e.g. ammonia.

Figure 1:
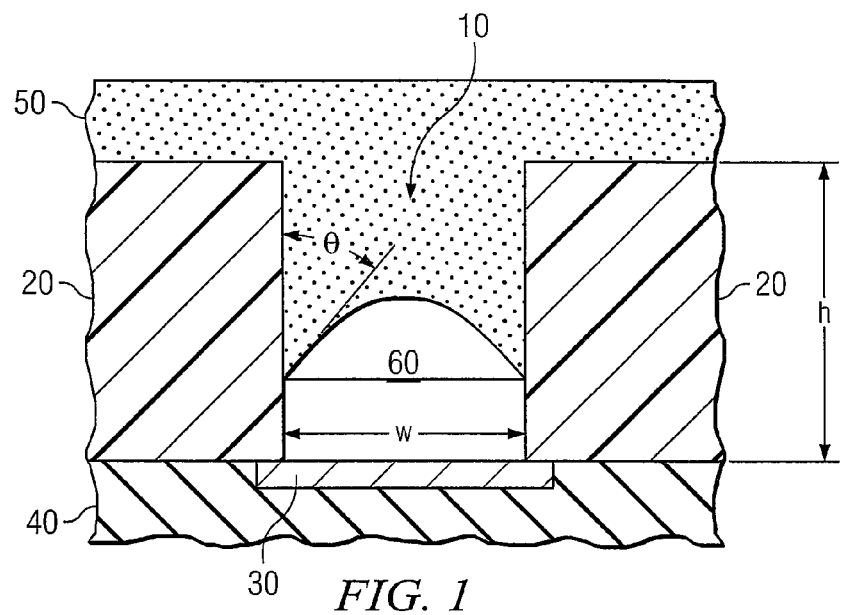
FIG. 1 is a cross sectional view of a semiconductor device illustrating incomplete cleaning in the prior art caused by a gas bubble in a recessed feature.
Figure 3A:
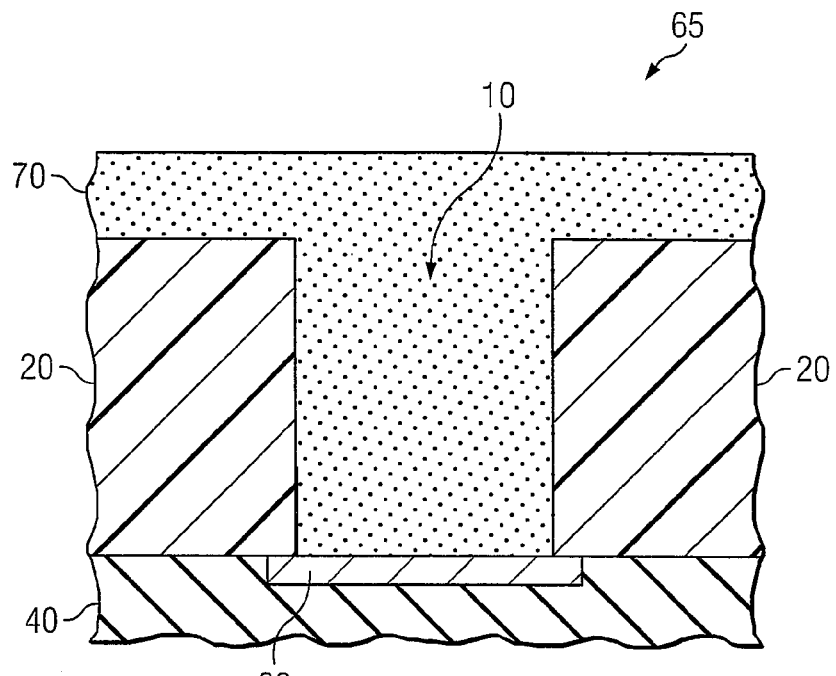
FIGS. 3a and 3b are cross sectional views of an intermediate semiconductor device illustrating gas purging from a recessed feature according to preferred embodiments.
Figure 3B:
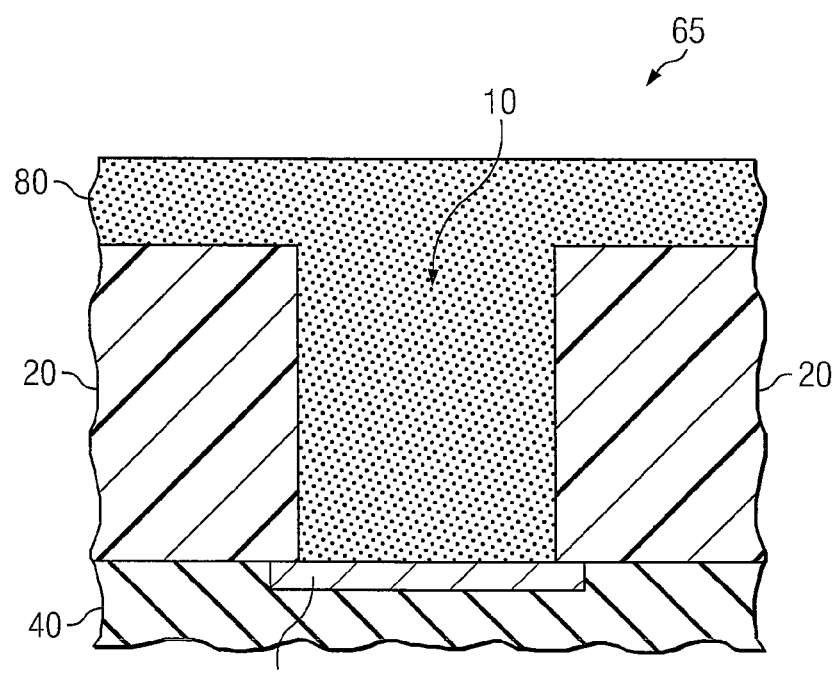

Turning now to a preferred embodiment of the invention, there is provided a method for wet cleaning a semiconductor wherein problems such as bubble formation in recessed features is avoided. FIGS. 3a to 3b show a cross section of a conventional semiconductor such as that described above with respect to FIG. 1. Illustrated within FIG. 3a is a device 65 at an intermediate stage of fabrication. The recessed feature 10 may comprise a via opening formed through the ILD 20, the interconnect layer 30, the interconnect layer 30 being within another dielectric layer 40. By way of example, the recessed feature 10 may represent an intermediate damascene interconnect structure.

Continuing with FIG. 3a, initially the intermediate device 65 is an air ambient typical of a conventional wet cleaning process such as an RCA method. The RCA cleaning process, as well as other conventional wet cleaning methods, are described in U.S. Pat. No. 6,295,998 to Keduelka et al, which patent is hereby incorporated in its entirety by reference. In accordance with preferred embodiments, the air ambient 70 (a first gas) is replaced with a second gas 80 that is highly soluble in the cleaning solvent.

The first gas 70 may be replaced using a conventional pump/backfill sequence wherein the cleaning vessel is partially evacuated and then backfilled with the second gas 80. Alternatively, the first gas 70 is replaced with the second gas 80 by simply flushing the cleaning vessel with the second gas 80. The cleaning vessel may be backfilled to any suitable pressure, a cleaning pressure, which may be less than or greater than atmospheric pressure. A high cleaning pressure enhances gas solubility, but it increases equipment cost. If a low cleaning pressure is used, the cleaning pressure should preferably be at least greater than the vapor pressure of the cleaning solution to avoid boiling it.

As noted earlier, conventional cleaning methods such as RCA, Piranha, and ozonation use aqueous solutions. While this embodiment is illustrated using an aqueous solution, alternative embodiments are equally effective in non-aqueous cleaning solutions.

In keeping with preferred embodiments, the second gas 80 may be selected using published gas/liquid solubility parameters. Henry's gas equation, $p_A = H^* c_A$, enables a convenient way to estimate the solubility of a particular gas. Gases such as nitrogen, air, and oxygen, are relatively insoluble in water compared to a gases such as carbon dioxide or ammonia. For example, for a given partial pressure of gas, it is clear that a given volume of water will dissolve many times the amount of ammonia as nitrogen. Such a result agrees with the dissolution time $t_d$ predicted by Equation 1 and the mass flux $N_A$ predicted by Equation 2.

In further keeping with principles known in the chemical arts, it is known that the mass flux, $N_A$, may be further increased by selecting a gas that is reactive with the liquid phase. For example, consider the case where the gas is consumed by the liquid through a first order, irreversible chemical reaction. For such a reaction, the reaction rate, $r_A$ is given by $r_A = k_r c_A$. In such a case, the mass flux from the gas to the liquid is given by Equation 3.

Equation 3:
$$N_A = \frac{(p_A - Hc_A)}{(RT/k_G) + (H/k_L)(\tanh(\alpha)/\alpha)} \left( p_A - \frac{Hc_A}{\cosh(\alpha)} \right)$$

In Equation 3, $\alpha$ is given $\alpha = ((k_r D_L)/k^2_L)^{1/2}$, and it represents a dimensionless ratio of the reaction rate to the diffusion rate. As shown by Equation 3, an irreversible chemical reaction has the effect of increasing the mass flux into the liquid.

Turning now to an alternative embodiment of the invention, there is provided a method for wet cleaning a semiconductor wherein bubble formation in recessed features is avoided by using a reactive gas. The chemical reaction effect may be employed to reduce bubble formation caused with a sparingly or slightly soluble gas. For example, carbon dioxide, which is not highly soluble in water, may be made to react with water, for example by the addition of a mildly basic buffer to the aqueous solution. Approximately 1% of the carbon dioxide dissolved in water forms carbonic acid. By adding a conventional, mildly basic buffer to the cleaning solution, the effectiveness of carbon dioxide compared to air in reducing bubble formation may be greatly improved.

Figure 4A:
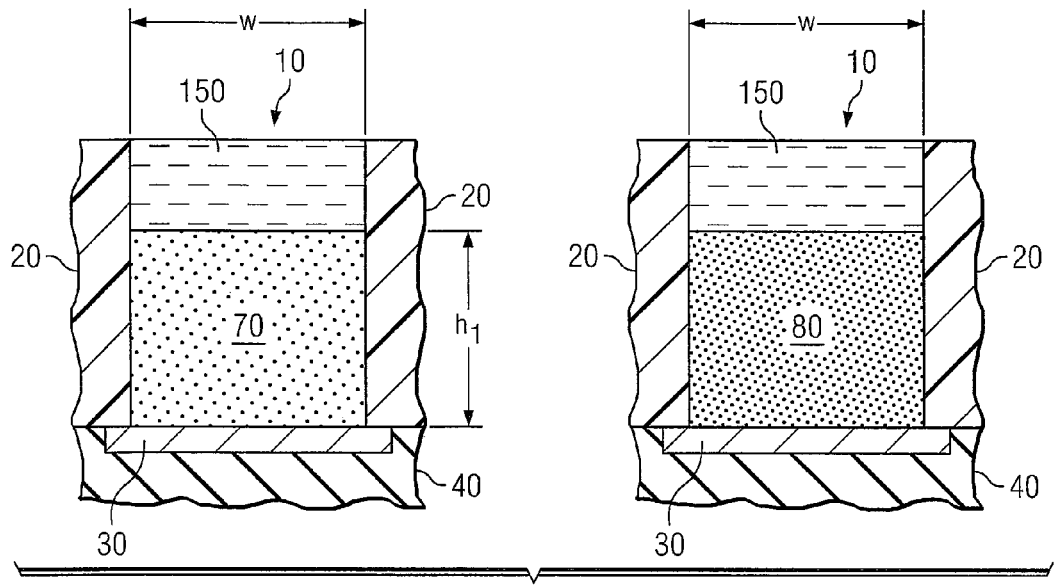
FIGS. 4a and 4b are cross sectional views of an intermediate semiconductor device further illustrating removal of a trapped bubble from a recessed feature according to a preferred embodiment.
Figure 4B:
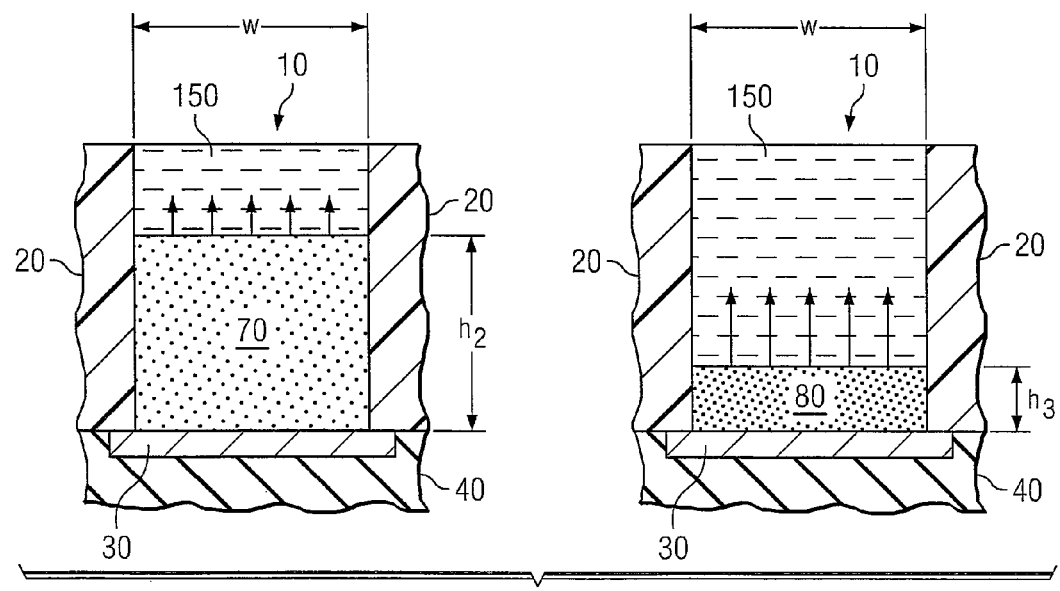

In FIGS. 4a and 4b there is illustrated an enlarged view of the recessed feature 10 of FIGS. 3a and 3b further illustrating an advantage of preferred embodiments. FIGS. 4a and 4b compare a sparingly or slightly soluble gas 70, such as air, with a highly soluble gas 80, such as ammonia, at two instants in time, t=0 and t=0+Δt. Initially, the total volume of the bubbles formed by air 70 and ammonia 80 are essentially identical, since the total volume of the trapped gas is reasonably approximately by the ideal gas law, V=nRT/P. Note also that cleaning fluid 150 is highly non-wetting as evidenced by the near planarity of the gas/liquid interface.

Continuing with FIG. 4b, there is illustrated the Figure of 4a at an arbitrary instant in time after t=0. Since ammonia is much more soluble in water than air, the mass flux from the gas to the liquid is much greater for ammonia, which is represented by the larger mass flux vector arrows of FIG. 4b. At time t=0+Δt only a small amount of air is illustrated as having been dissolved therefore $h_2 \approx h_1$. However, for the case of highly soluble ammonia, the trapped gas bubble volume is greatly reduced as shown by $h_3 < h_1$.

In further keeping with preferred embodiments, the rate of trapped ammonia removed may be enhanced by causing it to react with the cleaning solution. Water may be made weakly acidic using a buffer (since dissolved ammonia is basic). However, with acid cleaning solutions, such as RCA, no buffering is needed. Embodiments are expected to be advantageous for the RCA/ammonia system because ammonia is both highly soluble as well as reactive.

In applications where the rate of chemical reaction must be reduced, e.g. to control the heat of reaction, the temperature of the cleaning vessel may be lowered. However, preferred embodiments reduce the rate of reaction by diluting the purging gas with an inert gas, more preferably an insoluble inert gas. Insolubility of the inert gas is more preferred in order enhance removal of the purging gas from the cleaning solution. Suitable insoluble inert gases include nitrogen ($N_2$), helium (He), neon (Ne), argon (Ar), krypton (Kr), xenon (Xe), and radon (Rn).

An insoluble inert gas may also be used to enhance diffusion of the second gas from narrow recessed features during rinsing. Replacing the second gas with the insoluble inert gas reduces the partial pressure of the soluble gas. This decreases the concentration of the soluble gas in the liquid cleaning solution, which thereby increases diffusion from the narrow recessed feature.

In other embodiments, highly soluble gases (i.e. purging gases) include HCl, HBr, HI, anhydrides of strong acids, $SO_2$, $SO_3$, HF, and $H_2S$. As described above, sparingly or slightly soluble gases such as $CO_2$, may become as effective in reducing bubble formation as a highly soluble gas by inducing a chemical reaction, such as with a buffer. In other words, the chemical reaction has the effect of solubilizing an essentially insoluble gas.

In addition to air and nitrogen, sparingly or slightly soluble gases include helium (He), neon (Ne), argon (Ar), krypton (Kr), xenon (Xe), radon (Rn), hydrogen ($H_2$), or light hydrocarbons such as methane ($CH_4$) and ethane ($C_2H_6$).

In further keeping with the invention, the cleaning process may further include temperature adjustments aimed at improving the embodiments described herein. For example, wafer heating advantageously volatilizes trapped gases. It also generally increases chemical reaction rates as well as increases the solubility of cleaner surfactants.

In one exemplary embodiment, a wafer is placed in a cleaning area having an air ambient. The wafer is heated to about 90° C. The chamber is then flushed with an ammonia purging gas. After purging essentially all of the air, the wafer is rinsed with the cleaner. Heating advantageously avoids bubble formation by increasing gas volatility and lowering liquid surface tension.

Including a temperature adjustment is particularly advantageous with purging gases that are liquids near room temperature. This is because liquids having a boiling point between about 30 to 90° C. are conveniently vaporized and condensed at benign processing temperatures. Examples of such condensable purging gases include methanol, ethanol, propanol, 1,2 ethanediol, 1,2,3 propantriol, formaldehyde, acetone, diethyl ether, THF, methylamine, methylchloride, dichlormethane, trichlormethane, acetic acid ethyl ester, and combinations thereof.

An embodiment that comprises cleaning a wafer with a condensable purging gas includes heating a wafer in a cleaning area to a temperature greater than the boiling point of the purging gas. A suitable purging period removes essentially all of the air (or other first gas) from the vapor phase within the cleaning area. After the purging step, the wafer is cleaned by rinsing it with the cleaning solution.

In alternative embodiments, the cleaning step further includes lowering the temperature of the cleaning area in order to condense the second gas following removal of the first gas. In one embodiment, the cleaning area includes a wafer area and a vapor area, wherein the wafer and vapor areas have independently controlled temperature zones. In one embodiment, the wafer temperature remains above the purging gas's boiling temperature as the vapor temperature ramps down, thereby providing enhanced removal of any dissolved purging gas. The condensate may be collected for further use.

Figure 5:
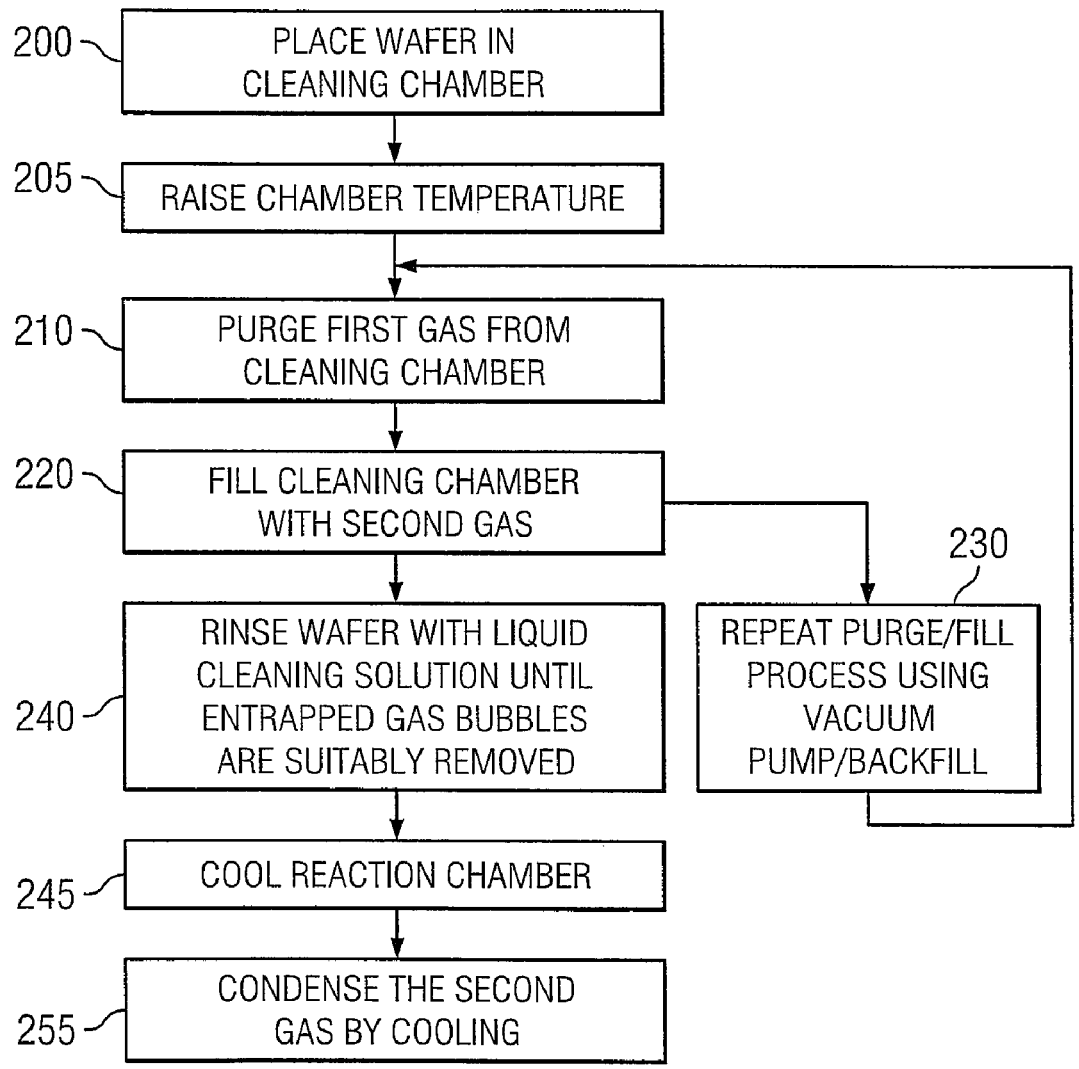
FIG. 5 is a process flow diagram illustrating a semiconductor cleaning method according to preferred embodiments.

FIG. 5 summarizes the cleaning steps included in some of the embodiments described herein. Briefly, the cleaning method begins at step 200 by placing a wafer or semiconductor device in a cleaning apparatus, such as a chamber. The method may optionally include a step 205 that includes raising the temperature of at least the wafer, above room temperature. Depending upon the process, step 210, purging the first gas, follows step 200 or step 205. After the gas-purging step 210, the chamber is filled with the second gas in step 220. In order to fully flush or otherwise remove the first gas from the chamber, the cleaning method may further include repeating a purge/fill step 230. Step 230 may include partially evacuating the chamber and backfilling it with the second gas, for example. Following the step 220, filling the chamber with the second gas, the wafer-washing step 240 follows. As described above, step 240 advantageously removes trapped gas bubbles, particularly from recessed features such as vias, trenches, etc. Further included in FIG. 5 are the steps of cooling the reaction chamber 245 and the optional step of condensing the second gas 255. Typically, steps 245 and 255 are only necessary when following optional chamber-heating step 205.

Although the present invention and its advantages have been described in detail, it should be understood that various changes, substitutions and alterations may be made herein without departing from the spirit and scope of the invention. For example, the cleaning embodiments described herein are equally suitable for front end of the line (FEOL) or back end of the line (BEOL) processing. They are suitable for wafers, intermediate devices, or finished devices. Furthermore, semiconductor cleaning is broad term that is known in the art to mean washing, rinsing, etching, or any other process for removing semiconductor contaminates.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

I claim:

1. A semiconductor cleaning method for removing entrapped gas from recessed features comprising:
   inserting a semiconductor device having a physical structure with an exposed semiconductor layer into a cleaning vessel, said semiconductor layer defining a plurality of gas entrapping recessed features, wherein the cleaning vessel includes a first gas, said first gas filling said cleaning vessel and in contact with said semiconductor device;
   replacing the first gas with a second gas, wherein the second gas has a solubility in a liquid cleaning solution greater than about 0.03 mole/liter, fills said cleaning vessel and is in contact with the semiconductor device;
   raising a temperature of the semiconductor device above a condensation temperature of the second gas while replacing the first gas, wherein the condensation temperature is between about 30 to 90° C.; and
   rinsing the semiconductor device, having said exposed semiconductor layer, with the liquid cleaning solution subsequent to said step of replacing the first gas with the second gas and such that any entrapped gas is removed from said recessed features and so that the liquid cleaning solution essentially fully wets the plurality of recessed features.

2. The method of claim 1, wherein the first gas includes air.

3. The method of claim 1, wherein replacing the first gas with a second gas includes flowing a stream of the second gas through the cleaning vessel.

4. The method of claim 1, wherein replacing the first gas with a second gas includes partially evacuating the cleaning vessel.

5. The method of claim 1, wherein the volume of the second gas is reduced by reacting chemically with the liquid cleaning solution.

6. The method of claim 5, wherein said second gas has a Henry's gas constant less than 0.8 atm/mole/liter.

7. The method of claim 1, wherein the liquid cleaning solution includes water.

8. The method of claim 1, wherein the second gas is selected from the group consisting essentially of chlorine dioxide, dichlorine monoxide, dinitrogen tetroxide, hydrogen peroxide, hydrogen sulfide, hydrozoic acid, carbon dioxide, sulfur dioxide, ammonia, HCl, HBr, HI, anhydrides of strong acids, $SO_3$, HF, methanol, ethanol, propanol, 1,2 ethanediol, 1,2,3 propantriol, formaldehyde, acetone, diethyl ether, THF, methylamine, methylchloride, dichloromethane, trichloromethane, acetic acid ethyl ester, and combinations thereof.

9. The method of claim 1, wherein rinsing the semiconductor device further includes condensing at least a portion of the second gas by cooling the semiconductor device to less than about room temperature.

10. The method of claim 1, wherein the semiconductor device comprises an intermediate semiconductor device.

11. A semiconductor cleaning method comprising:
    inserting a semiconductor device having a plurality of gas entrapping recessed features into a cleaning vessel, wherein the cleaning vessel includes a first gas, said first gas filling said cleaning vessel and in contact with said semiconductor device;
    replacing the first gas with a second gas, wherein the second gas is soluble in a liquid cleaning solution, fills said cleaning vessel and is in contact with the semiconductor device; and
    rinsing the semiconductor device with the liquid cleaning solution subsequent to said step of replacing the first gas with the second gas and such that any entrapped gas is removed from said recessed features and so that the liquid cleaning solution essentially fully wets the plurality of recessed features;
    heating a wafer area and a vapor area of the cleaning vessel above room temperature before replacing the first gas with the second gas;
    condensing a portion of the second gas by cooling at least the vapor area of the cleaning vessel after rinsing the semiconductor device; and
    cooling the wafer area to about room temperature after cooling at least the vapor area of the cleaning vessel.

12. A semiconductor cleaning method for removing entrapped gas from recessed features comprising:
    inserting a semiconductor device having a physical structure with an exposed semiconductor layer into a cleaning area, said semiconductor layer defining a plurality of gas entrapping recessed features into a cleaning area, wherein the cleaning area is filled with a first gas that is in contact with said semiconductor device;
    purging the first gas from the cleaning area by flowing a second gas therethrough, wherein the second gas fills said cleaning area, is in contact with the semiconductor device and has a condensation temperature greater than about room temperature, wherein the condensation temperature is between about 30 to 90° C., and wherein the second gas is soluble in a liquid cleaning solution;
    raising a temperature of the semiconductor device above the condensation temperature of the second gas while purging the first gas from the cleaning area; and
    rinsing the semiconductor device with the liquid cleaning solution after purging the first gas from the cleaning area by flowing said second gas therethrough.

13. The method of claim 12, wherein the liquid cleaning solution includes water.

14. The method of claim 12, wherein purging the first gas from the cleaning area further includes partially evacuating the cleaning area at least once before flowing the second gas therethrough.

15. A semiconductor cleaning method for removing entrapped gas from recessed features comprising:
    inserting a semiconductor device having a physical structure with an exposed semiconductor layer into a cleaning area, said semiconductor layer defining a plurality of gas entrapping recessed features into a cleaning area, wherein the cleaning area is filled with a first gas that is in contact with said semiconductor device;
    purging the first gas from the cleaning area by flowing a second gas therethrough, wherein the second gas fills said cleaning area, is in contact with the semiconductor device and has a condensation temperature greater than about room temperature, wherein the second gas is soluble in a liquid cleaning solution, and wherein the second gas consists essentially of methanol, ethanol, propanol, 1,2 ethanediol, 1,2,3 propantriol, formaldehyde, acetone, diethyl ether, THF, methylamine, methylchloride, dichloromethane, trichloromethane, acetic acid ethyl ester, and combinations thereof;
    raising a temperature of the semiconductor device above the condensation temperature of the second gas while purging the first gas from the cleaning area; and
    rinsing the semiconductor device with the liquid cleaning solution after purging the first gas from the cleaning area by flowing said second gas therethrough.

16. A semiconductor cleaning method for removing entrapped gas from recessed features comprising:

inserting a semiconductor device into a cleaning area, wherein the cleaning area is filled with a first gas that is in contact with said semiconductor device;

removing the first gas by partially evacuating the cleaning area;

back filling the cleaning area with a second gas that is soluble in a liquid cleaning solution and is in contact with the semiconductor device;

heating the cleaning area to a temperature greater than the boiling point of the second gas, wherein the boiling point of the second gas is between about 30° C. to about 90° C.; and washing the semiconductor device with the liquid cleaning solution after back filling the cleaning area with the second gas.

17. The method of claim 16, wherein the liquid cleaning solution includes water.

* * * * *